United States Patent
Zhu et al.

(10) Patent No.: US 12,165,258 B2
(45) Date of Patent: *Dec. 10, 2024

(54) ACTION-CONDITIONAL IMPLICIT DYNAMICS OF DEFORMABLE OBJECTS

(71) Applicant: NVIDIA Corporation, Santa Clara, CA (US)

(72) Inventors: Yuke Zhu, Austin, TX (US); Bokui Shen, Palo Alto, CA (US); Christopher Bongsoo Choy, Los Angeles, CA (US); Animashree Anandkumar, Pasadena, CA (US)

(73) Assignee: NVIDIA Corporation, Santa Clara, CA (US)

( * ) Notice: Subject to any disclaimer, the term of this patent is extended or adjusted under 35 U.S.C. 154(b) by 394 days.

This patent is subject to a terminal disclaimer.

(21) Appl. No.: 17/691,723

(22) Filed: Mar. 10, 2022

(65) Prior Publication Data

US 2023/0290057 A1    Sep. 14, 2023

(51) Int. Cl.
  *G06T 17/10*   (2006.01)
  *G06N 20/20*   (2019.01)
  *G06T 19/20*   (2011.01)

(52) U.S. Cl.
  CPC ............ *G06T 17/10* (2013.01); *G06N 20/20* (2019.01); *G06T 19/20* (2013.01); *G06T 2219/2021* (2013.01)

(58) Field of Classification Search
  CPC .................. G06T 17/10; G06T 19/20; G06T 2219/2021; G06T 17/20; G06N 20/20;
  (Continued)

(56) References Cited

U.S. PATENT DOCUMENTS

2021/0073525 A1*   3/2021   Weinzaepfel ....... G06F 18/2411

FOREIGN PATENT DOCUMENTS

CN   109360268 A  *  2/2019  ............. G06T 15/55

OTHER PUBLICATIONS

Lal et al., CoCoNets: Continuous Contrastive 3D Scene Representations, Apr. 2021, http://arxiv.org/licenses/nonexclusive-distrib/1.0/). (Year: 2021).*

(Continued)

*Primary Examiner* — Said M Elnoubi
(74) *Attorney, Agent, or Firm* — Taylor English Duma L.L.P.

(57) ABSTRACT

One or more machine learning models (MLMs) may learn implicit 3D representations of geometry of an object and of dynamics of the object from performing an action on the object. Implicit neural representations may be used to reconstruct high-fidelity full geometry of the object and predict a flow-based dynamics field from one or more images, which may provide a partial view of the object. Correspondences between locations of an object may be learned based at least on distances between the locations on a surface corresponding to the object, such as geodesic distances. The distances may be incorporated into a contrastive learning loss function to train one or more MLMs to learn correspondences between locations of the object, such as a correspondence embedding field. The correspondences may be used to evaluate state changes when evaluating one or more actions that may be performed on the object.

20 Claims, 7 Drawing Sheets

(58) Field of Classification Search
CPC ...... G06N 20/00; G06V 10/806; G06V 20/64; G06V 10/82; G06F 30/20
See application file for complete search history.

(56) References Cited

OTHER PUBLICATIONS

Mescheder, L., et al., "Occupancy Networks: Learning 3D Reconstruction in Function Space", In CVPR, pp. 4460-4470 (2019).
Miller, S., et al., "A geometric approach to robotic laundry folding", The International Journal of Robotics Research, pp. 1-20 (2013).
Moll, M., and Kavraki, L., E., "Path Planning for Deformable Linear Objects", IEEE Transactions on Robotics, vol. 22, No. 4, pp. 625-636 (2006).
Monti, F., et al., "Geometric deep learning on graphs and manifolds using mixture model CNNs", In CVPR, IEEE, pp. 5115-5124 (2017).
Moore, P., and Molloy, D., "A Survey of Computer-Based Deformable Models", In International Machine Vision and Image Processing Conference, IEEE, pp. 1-10 (2007).
Mrowca, D., et al., "Flexible Neural Representation for Physics Prediction", 32nd Conference on Neural Information Processing Systems (NeurIPS), pp. 1-12 (2018).
Müller, M., et al., "Position Based Dynamics", Journal of Visual Communication and Image Representation, pp. 1-23 (2006).
Murez, Z., et al., "Atlas: End-to-End 3D Scene Reconstruction from Posed Images", In Computer Vision—ECCV 2020 16th European Conference, Springer, pp. 1-18 (Oct. 2020).
Navarro-Alarcon, D., and Liu, Y., H., "Fourier-Based Shape Servoing: A New Feedback Method to Actively Deform Soft Objects into Desired 2D Image Contours", IEEE Transactions on Robotics, pp. 1-8 (2017).
Navarro-Alarcon, D., et al., "Automatic 3-D Manipulation of Soft Objects by Robotic Arms With an Adaptive Deformation Model", IEEE Transactions on Robotics, pp. 1-13 (2016).
Navarro-Alarcon, D., et al., "On the visual deformation servoing of compliant objects: Uncalibrated control methods and experiments", The International Journal of Robotics Research, vol. 33, No. 11, pp. 1462-1480 (2014).
Nealen, A., et al., "Physically Based Deformable Models in Computer Graphics", In Computer graphics forum, pp. 1-24 (2005).
Niemeyer, M., et al., "Occupancy Flow: 4D Reconstruction by Learning Particle Dynamics", In ICCV, IEEE, pp. 5379-5389 (2019).
Park, J., J., et al., "DeepSDF: Learning Continuous Signed Distance Functions for Shape Representation", In Proceedings of the IEEE/CVF Conference on Computer Vision and Pattern Recognition, pp. 165-174 (2019).
Paszke, A., et al., "PyTorch: An Imperative Style, High-Performance Deep Learning Library", In 33rd Conference on Neural Information Processing Systems (NeurIPS), pp. 1-12 (2019).
Peng, S., et al., "Convolutional Occupancy Networks", In ECCV, pp. 1-17 (2020).
Petit, A., et al., "Real-time tracking of 3D elastic objects with an RGB-D sensor", In 2015 IEEE/RSJ International Conference on Intelligent Robots and Systems (IROS), pp. 1-9 (2015).
Qi, C., R., et al., "PointNet: Deep Learning on Point Sets for 3D Classification and Segmentation", In Proceedings of the IEEE conference on computer vision and pattern recognition, pp. 652-660 (2017).
Qi, C., R., et al., "PointNet++: Deep Hierarchical Feature Learning on Point Sets in a Metric Space", 31st Conference on Neural Information Processing Systems (NIPS), pp. 1-10 (2017).
Quigley, M., et al., "ROS: an open-source Robot Operating System", In ICRA workshop on open source software, pp. 1-6 (2009).
Rempe, D., et al., "HuMoR: 3D Human Motion Model for Robust Pose Estimation", In International Conference on Computer Vision (ICCV), IEEE, pp. 11488-11499 (2021).
Riegler, G., et al., "OctNet: Learning Deep 3D Representations at High Resolutions", In Proceedings of the IEEE conference on computer vision and pattern recognition, IEEE, pp. 3577-3586 (2017).
Ronneberger, O., et al., "U-Net: Convolutional Networks for Biomedical Image Segmentation", In International Conference on Medical image computing and computer-assisted intervention, Springer, pp. 234-241 (2015).
Roussel, O., et al., "Manipulation planning with contacts for an extensible elastic rod by sampling on the submanifold of static equilibrium configurations", IEEE International Conference on Robotics and Automation (ICRA), pp. 1-7 (2015).
Rusu, R., B., et al., "Fast Point Feature Histograms (FPFH) for 3D Registration", In ICRA, IEEE, pp. 1-6 (2009).
Sahillioğlu, Y., "Recent advances in shape correspondence", The Visual Computer, pp. 1705-1721 (2019).
Saito, S., et al., "PIFu: Pixel-Aligned Implicit Function for High-Resolution Clothed Human Digitization", In ICCV, IEEE, pp. 2304-2314 (2019).
Sanchez, J., et al., "Robotic Manipulation and Sensing of Deformable Objects in Domestic and Industrial Applications: A Survey", The International Journal of Robotics Research, pp. 1-35 (2018).
Sanchez-Gonzalez, A., et al., "Learning to Simulate Complex Physics with Graph Networks", In International Conference on Machine Learning, pp. 1-10 (2020).
Schulman, J., et al., "Tracking Deformable Objects with Point Clouds", IEEE International Conference on Robotics and Automation, pp. 1-8 (2013).
Sitzmann, V., et al., "Implicit Neural Representations with Periodic Activation Functions", 34th Conference on Neural Information Processing Systems (NeurIP), pp. 1-12 (2020).
Sitzmann, V., et al., "Scene Representation Networks: Continuous 3D-Structure-Aware Neural Scene Representations", In Proceedings of the 33rd International Conference on Neural Information Processing Systems, pp. 1-12 (2019).
Tang, T., et al., "State Estimation for Deformable Objects by Point Registration and Dynamic Simulation", In IEEE/RSJ International Conference on Intelligent Robots and Systems (IROS), pp. 1-7 (2017).
Tatarchenko, M., et al., "What Do Single-view 3D Reconstruction Networks Learn?", In Proceedings of the IEEE/CVF Conference on Computer Vision and Pattern Recognition, IEEE, pp. 3405-3414 (2019).
Terzopoulos, D., and Fleischer, K., "Deformable models", The visual computer, vol. 4, No. 6, pp. 306-331 (1988).
Terzopoulos, D., and Metaxas, D., "Dynamic 3D Models With Local And Global Deformations: Deformable Superquadrics", IEEE Transactions on pattern analysis and machine intelligence, vol. 13, No. 7, pp. 703-714 (Jul. 1991).
Tran, L., and Liu, X., "On Learning 3D Face Morphable Model from In-the-wild Images", IEEE TPAMI, pp. 1-14 (2019).
Tung, H., et al., "Self-supervised Learning of Motion Capture", 31st Conference on Neural Information Processing Systems (NIPS), pp. 1-11 (2017).
Tung, H., F., et al., "3D-OES: Viewpoint-Invariant Object-Factorized Environment Simulators", 4th Conference on Robot Learning (CoRL), pp. 1-15 (2020).
Ummenhofer, B., et al., "Lagrangian Fluid Simulation With Continuous Convolutions", In ICLR, pp. 1-15 (2020).
Wu, S., et al., "DOVE: Learning Deformable 3D Objects by Watching Videos", arXiv:2107.10844v1 [cs.CV], pp. 1-17 (Jul. 2021).
Xie, S., et al., "PointContrast: Unsupervised Pre-training for 3D Point Cloud Understanding", In ECCV, pp. 1-24 (Nov. 2020).
Xu, Z., et al., "Learning 3D Dynamic Scene Representations for Robot Manipulation", 4th Conference on Robot Learning (CoRL), pp. 1-17 (Dec. 2020).
Yan, M., et al., "Self-Supervised Learning of State Estimation for Manipulating Deformable Linear Objects", IEEE robotics and automation letters, pp. 1-12 (2020).
Yan, W., et al., "Learning Predictive Representations for Deformable Objects Using Contrastive Estimation", In CoRL, pp. 1-9 (2020).

(56) References Cited

OTHER PUBLICATIONS

Yang, Z., et al., "Continuous Geodesic Convolutions for Learning on 3D Shapes", In Proceedings of the IEEE/CVF Winter Conference on Applications of Computer Vision, pp. 134-144 (2021).
Yao, Y., et al., "MVSNet: Depth Inference for Unstructured Multi-view Stereo", In Proceedings of the European Conference on Computer Vision (ECCV), pp. 1-17 (2018).
Zhang, J., Y., et al., "Predicting 3D Human Dynamics from Video", In ICCV, IEEE, pp. 7114-7123 (2019).
Zuffi, S., et al., "3D Menagerie: Modeling the 3D Shape and Pose of Animals", In CVPR, IEEE, pp. 6365-6373 (2017).
Zuffi, S., et al., "Three-D Safari: Learning to Estimate Zebra Pose, Shape, and Texture from Images "In the Wild"", In ICCV, IEEE, pp. 5359-5368 (2019).
"Nvidia Omniverse" Retrieved from Internet URL : https://www.nvidia.com/en-in/omniverse/, pp. 1-16 (access date: Jun. 1, 2022).
Battaglia, P., W., et al., "Interaction Networks for Learning about Objects, Relations and Physics", Retrieved from Internet URL : : https://www.researchgate.net/publication/311299547, pp. 1-12 (Dec. 2016).
Bogo, F., et al., "Keep It SMPL: Automatic Estimation of 3D Human Pose and Shape from a Single Image", In ECCV, pp. 561-578 (2016).
Boscaini, D., et al., "Learning shape correspondence with anisotropic convolutional neural networks", 30th Conference on Neural Information Processing Systems (NIPS), pp. 1-9 (2016).
Byravan, A., and Fox, D., "SE3-Nets: Learning Rigid Body Motion using Deep Neural Networks", In ICRA, pp. 1-8 (Mar. 2017).
Chang, A., X., et al., "ShapeNet: An Information-Rich 3D Model Repository", arXiv:1512.03012v1 [cs.GR], pp. 1-11 (Dec. 2015).
Chen, Z., and Zhang, H., "Learning Implicit Fields for Generative Shape Modeling", In CVPR, pp. 5939-5948 (2019).
Choy, C., B., et al., "3D-R2N2: A Unified Approach for Single and Multi-view 3D Object Reconstruction", In ECCV, Springer, DOI: 10.1007/978-3-319-46484-8 38, pp. 628-644 (2016).
"Choy, C., et al., ""Fully Convolutional Geometric Features"", In ICCV, IEEE, pp. 8958-8966 (2019)".
Deng, B., et al., "NASA Neural Articulated Shape Approximation", In ECCV, arXiv:1912.03207v4 [cs.CV], pp. 1-21 (Jul. 2020).
Deng, H., et al., "PPFNet: Global Context Aware Local Features for Robust 3D Point Matching", In Proceedings of the IEEE conference on computer vision and pattern recognition, pp. 195-205 (2018).
Donati, N., et al., "Deep Geometric Functional Maps: Robust Feature Learning for Shape Correspondence", In CVPR, IEEE, pp. 8592-8601 (2020).
Eisenberger, M., et al., "Deep Shells: Unsupervised Shape Correspondence with Optimal Transport", 34th Conference on Neural Information Processing Systems (NeurIPS), pp. 1-12 (2020).
Eisenberger, M., et al., "NeuroMorph: Unsupervised Shape Interpolation and Correspondence in One Go", In CVPR, IEEE, pp. 7473-7483 (2021).
Erez, T., et al., "Simulation Tools for Model-Based Robotics: Comparison of Bullet, Havok, MuJoCo, ODE and PhysX", IEEE International Conference on Robotics and Automation (ICRA), pp. 4397-4404 (2015).
Feng, Y., et al., "Joint 3D Face Reconstruction and Dense Alignment with Position Map Regression Network", ECCV, pp. 1-18 (2018).
Finn, C., and Levine, S., "Deep Visual Foresight for Planning Robot Motion", In ICRA, pp. 1-8 (2017).
Gan, C., et al., "ThreeDWorld: A Platform for Interactive Multi-Modal Physical Simulation", In 35th Conference on Neural Information Processing Systems (NeurIPS), pp. 1-23 (Dec. 2021).
Godard, C., et al., "Unsupervised Monocular Depth Estimation with Left-Right Consistency", In Proceedings of the IEEE conference on computer vision and pattern recognition, pp. 270-279 (2017).
Goel, S., et al., "Shape and Viewpoint without Keypoints", In ECCV, U-CMR, pp. 1-25 (Jul. 2020).
Groueix, T., et al., "3D-CODED : 3D Correspondences by Deep Deformation", In ECCV, pp. 1-17 (2018).
Hafner, D., et al., "Learning Latent Dynamics for Planning from Pixels", In Proceedings of the 36 th International Conference on Machine Learning, pp. 1-11 (2019).
Halimi, O., et al., "Unsupervised Learning of Dense Shape Correspondence", In CVPR, pp. 4370-4379 (2019).
Hoque, R., et al., "VisuoSpatial Foresight for Physical Sequential Fabric Manipulation", arXiv:2102.09754v2 [cs.RO], op. 1-43 (Jul. 2021).
Iu, Y., et al., "ChainQueen: A Real-Time Differentiable Physical Simulator for Soft Robotics", In ICRA, pp. 1-13 (Oct. 2018).
Hu, Y., et al., "Taichi: A Language for High-Performance Computation on Spatially Sparse Data Structures", ACM Transactions on Graphics (TOG), vol. 38, No. 6, pp. 1-16 (2019).
Ju, Y., et al., "Difftaichi: Differentiable Programming for Physical Simulation", In ICLR, pp. 1-20 (Feb. 2020).
Huang, Z., et al., "Plasticinelab: a Soft-Body Manipulation Benchmark With Differentiable Physics", In ICLR, pp. 1-18 (Apr. 2021).
Jiang, C., et al., "ShapeFlow: Learnable Deformations Among 3D Shapes", 34th Conference on Neural Information Processing Systems (NeurIPS), pp. 1-16 (Jun. 2021).
Kaick, O., V., et al., "A Survey on Shape Correspondence", In Computer graphics forum, pp. 1-24 (2011).
Kanazawa, A., et al., "End-to-end Recovery of Human Shape and Pose", In Cvpr, IEEE, pp. 7122-7131 (2018).
Kanazawa, A., et al., "Learning Category-Specific Mesh Reconstruction from Image Collections", In ECCV, pp. 1-16 (2018).
Kendall, M., G., "A New Measure of Rank Correlation", vol. 30, No. 1/2, pp. 1-4 (1938).
Kingma, D., P., and Ba, J., L., "ADAM: a Method for Stochastic Optimization", In ICLR, pp. 1-15 (2015).
Li, Y., et al., "3D Neural Scene Representations for Visuomotor Control", 5th Conference on Robot Learning (CoRL), pp. 1-12 (2021).
Li, Y., et al., "Causal Discovery in Physical Systems from Videos", 34th Conference on Neural Information Processing Systems (NeurIPS), pp. 1-13 (2020).
Li, Y., et al., "Learning Particle Dynamics for Manipulating Rigid Bodies, Deformable Objects, and Fluids", In ICLR, pp. 1-15 (Apr. 2019).
Li, Y., et al., "Model-Driven Feed-Forward Prediction for Manipulation of Deformable Objects", IEEE Transactions on Automation Science and Engineering, pp. 1-16 (2018).
Li, Y., et al., "Propagation Networks for Model-Based Control Under Partial Observation", In 2019 International Conference on Robotics and Automation (ICRA), IEEE, pp. 1-8 (2019).
Li, Y., et al., "Real-time Pose Estimation of Deformable Objects Using a Volumetric Approach", In 2014 IEEE/RSJ International Conference on Intelligent Robots and Systems, IEEE, pp. 1046-1052 (2014).
Li, Y., et al., "Recognition of Deformable Object Category and Pose", In ICRA, pp. 1-7 (2014).
Lin, X., et al., "Learning Visible Connectivity Dynamics for Cloth Smoothing", 5th Conference on Robot Learning (CoRL), pp. 1-11 (2021).
Lin, X., et al., "SoftGym: Benchmarking Deep Reinforcement Learning for Deformable Object Manipulation", In 4th Conference on Robot Learning (CoRL), pp. 1-18 (Mar. 2021).
Lippi, M., et al., "Latent Space Roadmap for Visual Action Planning of Deformable and Rigid Object Manipulation", In IEEE/RSJ International Conference on Intelligent Robots and Systems (IROS), IEEE, pp. 1-9 (2020).
Litany, O., et al., "Deep Functional Maps: Structured Prediction for Dense Shape Correspondence", In ICCV, IEEE, pp. 5659-5667 (2017).
Loper, M., et al., "SMPL1: A Skinned Multi-Person Linear Model", ACM TOG, DOI: http://doi.acm.org/10.1145/2816795.2818013, vol. 34, No. 6, pp. 1-16 (Nov. 2015).
Maaten, L., V., and Hinton, G., "Visualizing Data using t-SNE", Journal of Machine Learning Research, vol. 9, No. 11, pp. 2579-2605 (2008).
Macklin, M., et al., "Unified Particle Physics for Real-Time Applications", ACM Transactions on Graphics (TOG), pp. 1-12 (2014).

(56) References Cited

OTHER PUBLICATIONS

Mariolis, I., et al., "Pose and Category Recognition of Highly Deformable Objects Using Deep Learning", In 2015 International conference on advanced robotics (ICAR), IEEE pp. 1-8 (2015).
Merkel, D., "Docker: Lightweight Linux Containers for Consistent Development and Deployment", Linux journal, pp. 1-5 (2014).

* cited by examiner

ACTION-CONDITIONAL IMPLICIT DYNAMICS OF DEFORMABLE OBJECTS

BACKGROUND

Perceiving realistic deformable objects and modeling their dynamics over time is integral to building autonomous agents capable of interacting with soft objects. For example, when a robot is attempting to solve a task, it often needs to predict what will happen to an object if it performs a certain action. Many systems used to predict the consequences of performing actions on objects assume the objects are rigid and therefore may not be accurate for non-rigid objects. Estimating the geometry of volumetric deformable objects, such as plush toys and pizza dough, from raw visual signals and predicting their motions present significant challenges, in part, due to their infinite continuous configuration spaces, complex non-linear dynamics, partial observability, and self-collision.

Conventional methods may be used to model deformation from visual data. However, they focus on a limited variety of objects from specific categories, with constrained motions and no external action. Other conventional methods may be used to form dynamics models that capture the action-conditional motions of non-rigid objects. However, they either rely on high-fidelity mathematical models or learned approximations, which are difficult to estimate from raw sensor signals. Further conventional methods may rely on extracting geometric intermediate representations of objects for action-conditional dynamics. However, these approaches simplify the geometry of specific objects, such as ropes, or clothes, into either 1D or 2D representations. Thus, they are unable to handle deformation of realistic volumetric shapes, where knowledge about the complex volumes may be limited by a partial view.

SUMMARY

Embodiments of the present disclosure relate to action-conditional implicit dynamics of deformable objects. More specifically, the current disclosure relates to improvements in determining dynamics of an object (e.g., a volumetric deformable object) that would result were an action to be performed on the object. The current disclosure further relates to improvements in determining correspondences between locations corresponding to an object.

In some respects, one or more machine learning models (MLMs) may be used to learn implicit 3D representations of geometry of an object and of dynamics of the object from performing an action on the object. In least one embodiment, implicit neural representations may be used to reconstruct high-fidelity full geometry of the object and predict a flow-based dynamics field from one or more images, which may provide a partial view of the object.

In further respects, correspondences between locations of an object may be learned based at least on distances between the locations on a surface corresponding to the object, such as geodesic distances. In at least one embodiment, the distances may be incorporated into a contrastive learning loss function to train one or more MLMs to learn correspondences between locations of the object, such as a correspondence embedding field from which point-wise correspondence can be robustly established. The correspondences may be used to evaluate state changes when evaluating one or more actions that may be performed on the object.

In additional respects, a simulation framework may be used for testing, training, verification, and/or benchmarking. The framework may be built on a system including cloud-based physical simulation that is GPU-accelerated. In at least one embodiment, the physical simulation may include finite element method simulation that represents a deformable body volumetrically as a graph of connected tetrahedrons and/or other shapes.

BRIEF DESCRIPTION OF THE DRAWINGS

The present systems and methods for action-conditional implicit dynamics of deformable objects is described in detail below with reference to the attached drawing figures, wherein.

DETAILED DESCRIPTION

Figure 1A:
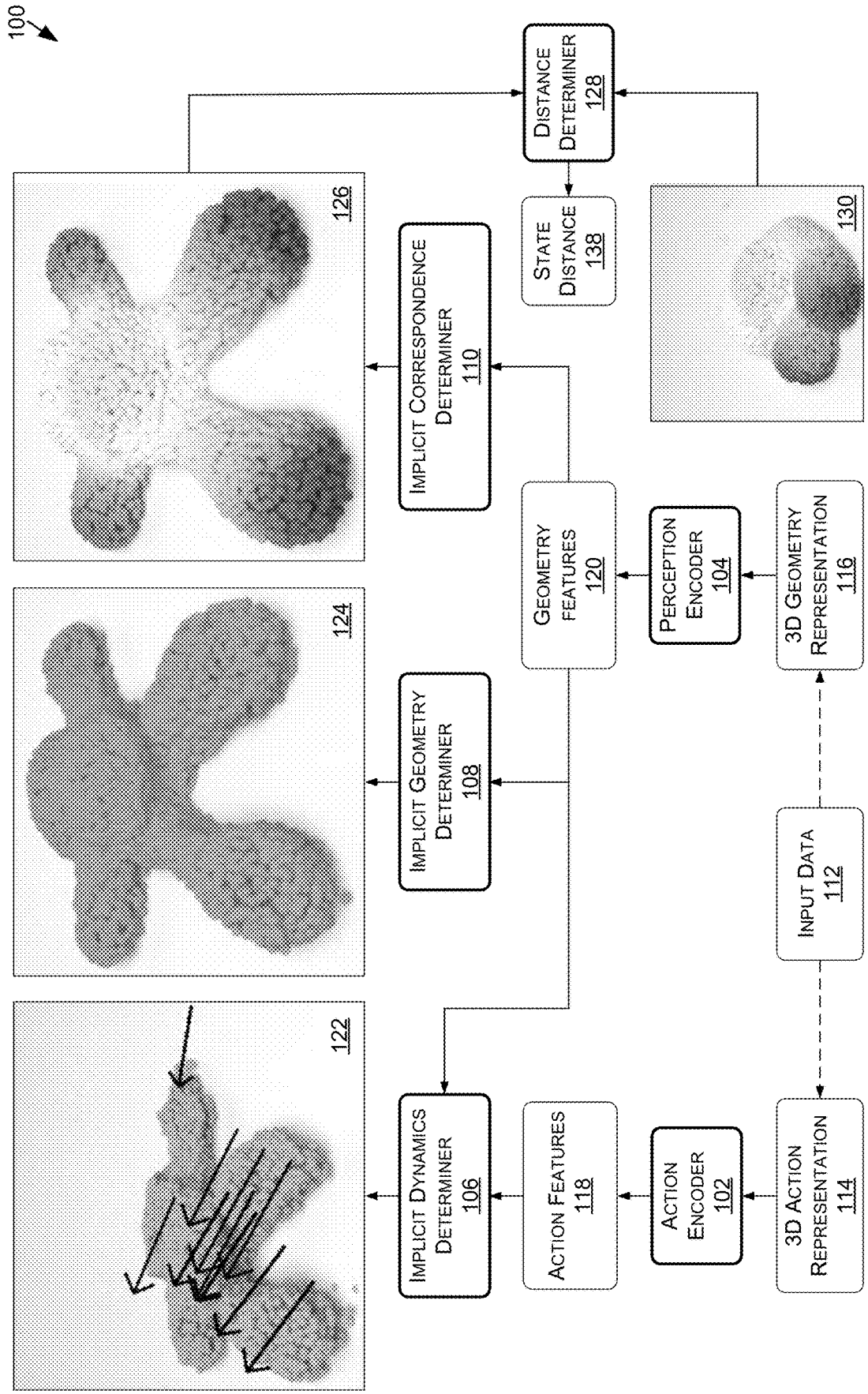
FIG. 1A is a data flow diagram illustrating an example process for evaluating an action on a volumetric deformable object, in accordance with at least one embodiment of the present disclosure.

Embodiments of the present disclosure relate to action-conditional implicit dynamics of deformable objects. More specifically, the current disclosure relates to improvements in determining dynamics of an object (e.g., a volumetric deformable object) that would result were an action to be performed on the object. The current disclosure further relates to improvements in determining correspondences between locations corresponding to an object.

In some respects, one or more machine learning models (MLMs) may be used to learn implicit 3D representations of geometry of an object and of dynamics of the object from performing an action on the object. In least one embodiment, implicit neural representations may be used to reconstruct high-fidelity full geometry of the object and predict a flow-based dynamics field from one or more images, which may provide a partial view of the object.

In further respects, correspondences between locations of an object may be learned based at least on distances between the locations on a surface corresponding to the object, such as geodesic distances. In at least one embodiment, the distances may be incorporated into a contrastive learning loss function to train one or more MLMs to learn correspondences between locations of the object, such as a correspondence embedding field from which point-wise correspondence can be robustly established. Learning the correspondences jointly with geometry and dynamics my improve dynamics prediction and the accuracy of downstream tasks, such as control operations that physically manipulate the object. The correspondences may be used to evaluate state changes when evaluating one or more actions that may be performed on the object.

In additional respects, a simulation framework may be used for testing, training, verification, and/or benchmarking. The framework may be built on a system including cloud-based physical simulation that is GPU-accelerated. In at least one embodiment, the physical simulation may include finite element method simulation that represents a deformable body volumetrically as a graph of connected tetrahedrons and/or other shapes.

The systems and methods described herein may be used for a variety of purposes, by way of example and without limitation, for machine control, machine locomotion, machine driving, synthetic data generation, model training, perception, augmented reality, virtual reality, mixed reality, robotics, security and surveillance, autonomous or semi-autonomous machine applications, deep learning, environment simulation, data center processing, conversational AI, light transport simulation (e.g., ray-tracing, path tracing, etc.), collaborative content creation for 3D assets, cloud computing and/or any other suitable applications.

Disclosed embodiments may be comprised in a variety of different systems such as automotive systems (e.g., a control system for an autonomous or semi-autonomous machine, a perception system for an autonomous or semi-autonomous machine), systems implemented using a robot, aerial systems, medial systems, boating systems, smart area monitoring systems, systems for performing deep learning operations, systems for performing simulation operations, systems implemented using an edge device, systems incorporating one or more virtual machines (VMs), systems for performing synthetic data generation operations, systems implemented at least partially in a data center, systems for performing conversational AI operations, systems for performing light transport simulation, systems for performing collaborative content creation for 3D assets, systems implemented at least partially using cloud computing resources, and/or other types of systems.

Now referring to FIG. 1A, FIG. 1A is a data flow diagram illustrating an example process 100 for evaluating an action on a volumetric deformable object, in accordance with at least one embodiment of the present disclosure. The process 100 may be performed using, for example, an action encoder 102, a perception encoder 104, an implicit dynamics determiner 106, an implicit geometry determiner 108, an implicit correspondence determiner 110, and a distance determiner 128. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software.

Figure 1B:
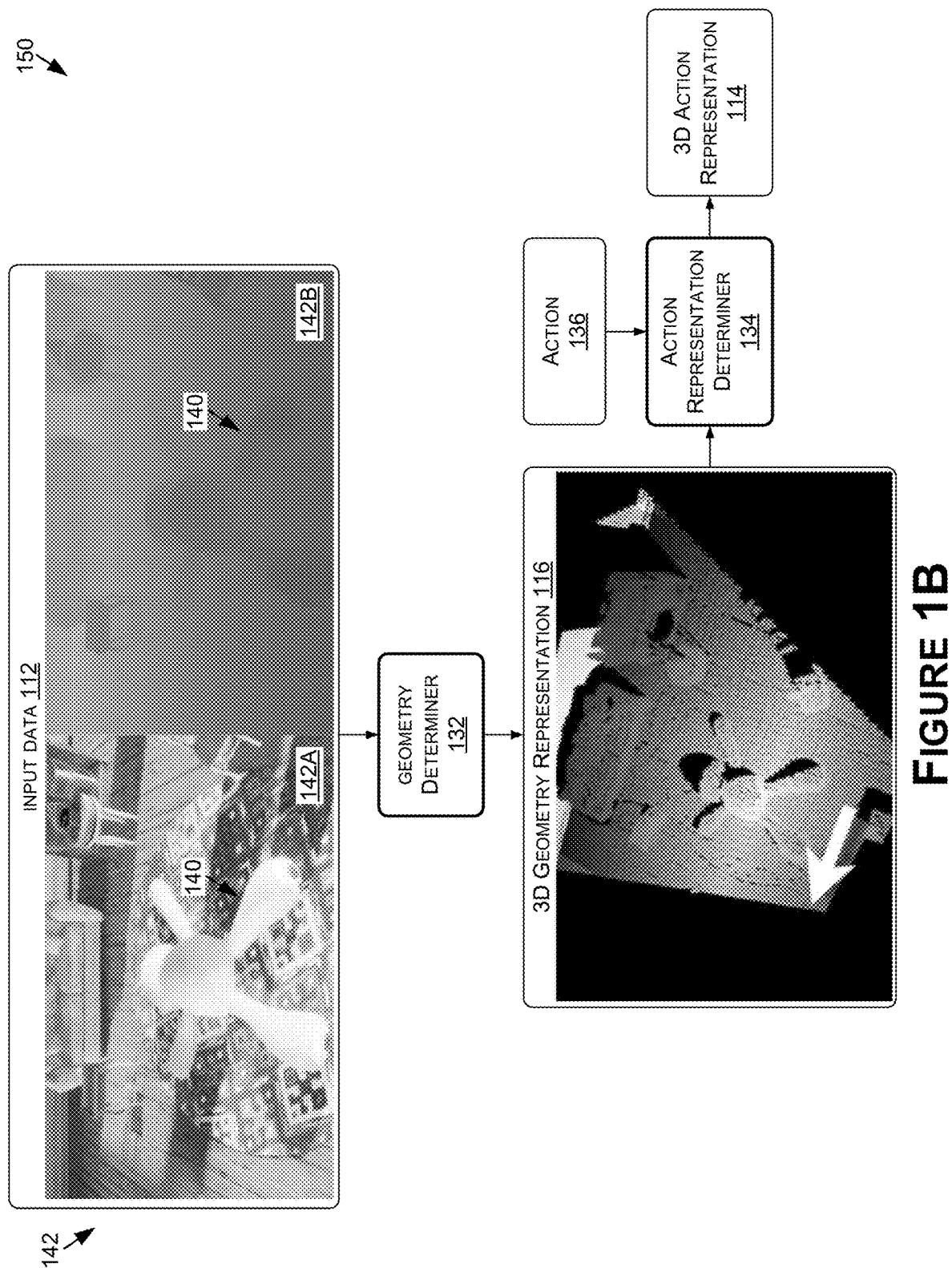
FIG. 1B is a data flow diagram illustrating an example process for processing input data, in accordance with at least one embodiment of the present disclosure.

At a high level, the process 100 may include the action encoder 102 receiving one or more inputs, such a 3D action representation 114, and generating one or more outputs, such as action features 118 (e.g., defining a 3D representation of performing an action on an object) from the one or more inputs. As indicated in FIGS. 1A and 1B, the 3D action representation 114 may be determined from input data 112, which may depict at least a portion of an object 140, on which the action may be performed. The process 100 may also include the perception encoder 104 receiving one or more inputs, such a 3D geometry representation 116, and generating one or more outputs, such as geometry features 120 (e.g., defining a 3D representation of geometry of the object) from the one or more inputs. As indicated in FIGS. 1A and 1B, the 3D geometry representation 116 may also be determined from the input data 112.

The process 100 may also include the implicit dynamics determiner 106 receiving one or more inputs, such as the action features 118 and the geometry features 120, and generating one or more outputs, such as implicit dynamics data 122 (e.g., comprising an implicit 3D representation of dynamics from performing the action on the object). The process 100 may further include the implicit geometry determiner 108 receiving one or more inputs, such as the geometry features 120, and generating one or more outputs, such as implicit geometry data 124 (e.g., comprising an implicit 3D representation of geometry of the object). The process 100 may further include the implicit correspondence determiner 110 receiving one or more inputs, such as the geometry features 120, and generating one or more outputs, such as implicit correspondence data 126 (e.g., comprising an implicit 3D representation of correspondences between locations of the object). The process 100 may additionally include the distance determiner 128 receiving one or more inputs, such as the implicit correspondence data 126 and implicit correspondence data 130 (e.g., for different states of the object), and generating one or more outputs, such as state distance 138 (e.g., a measure of similarity between the states of the object).

In at least one embodiment, the input data 112 may include image data and/or sensor data. For example, where the input data 112 includes image data, the image data may represent one or more images, such as an image(s) 142 shown in FIG. 1B. The image(s) 142 depict one or more portions of the object 140 in an environment. As shown, image data may include color information 142A. The image data may also include depth information 142B corresponding to the color information 142A and/or pixels of the image(s) 142. By way of example, and not limitation, the color information 142A and the depth information 142B be captured using one or more RGB-D images. In various examples, the depth information 142B may be provided separate from the image(s) 142 or may not be provided.

In at least one embodiment, the image(s) 142 (e.g., a color image) may be represented by image data generated using one or more cameras, such as one or more cameras of a robot, a vehicle (e.g., an autonomous vehicle), and/or another mobile or stationary machine(s) or device(s). The image data may include data representative of images of a field of view of one or more cameras, such as a stereo camera(s), a wide-view camera(s) (e.g., fisheye cameras), infrared camera(s), surround camera(s) (e.g., 360 degree cameras), long-range and/or mid-range camera(s), and/or other camera types.

In some embodiments, the input data 112 may additionally or alternatively include other types of sensor data, such as LIDAR data from one or more LIDAR sensors, RADAR data from one or more RADAR sensors, audio data from one or more microphones, etc.

In some examples, the image data may be captured in one format (e.g., RCCB, RCCC, RBGC, etc.), and then converted to another format (e.g., by an image processor). In examples, the image data may be provided as input to an image data pre-processor to generate pre-processed image data. Many types of images or formats may be used; for example, compressed images such as in Joint Photographic Experts Group (JPEG), Red Green Blue (RGB), or Luminance/Chrominance (YUV) formats, compressed images as frames stemming from a compressed video format (e.g., H.264/Advanced Video Coding (AVC), H.265/High Efficiency Video Coding (HEVC), VP8, VP9, Alliance for Open Media Video 1 (AV1), Versatile Video Coding (VVC), or any other video compression standard), raw images such as originating from Red Clear Blue (RCCB), Red Clear (RCCC) or other type of imaging sensor. In some examples, different formats and/or resolutions could be used for training the machine learning model(s) than for inferencing (e.g., during deployment of the machine learning model(s)).

In some embodiments, a pre-processing image pipeline may be employed by the image data pre-processor to process a raw image(s) acquired by a sensor(s) (e.g., camera(s)) and included in the image data to produce pre-processed image data which may represent an input image(s) to the input layer(s) (e.g., feature extractor layer(s)) of the machine learning model(s). An example of a suitable pre-processing image pipeline may use a raw RCCB Bayer (e.g., 1-channel) type of image from the sensor and convert that image to a RCB (e.g., 3-channel) planar image stored in Fixed Precision (e.g., 16-bit-per-channel) format. The pre-processing image pipeline may include decompanding, noise reduction, demosaicing, white balancing, histogram computing, and/or adaptive global tone mapping (e.g., in that order, or in an alternative order).

Where noise reduction is employed by the image data pre-processor, it may include bilateral denoising in the Bayer domain. Where demosaicing is employed by the image data pre-processor, it may include bilinear interpolation. Where histogram computing is employed by the image data pre-processor, it may involve computing a histogram for the C channel, and may be merged with the decompanding or noise reduction in some examples. Where adaptive global tone mapping is employed by the image data pre-processor, it may include performing an adaptive gamma-log transform. This may include calculating a histogram, getting a mid-tone level, and/or estimating a maximum luminance with the mid-tone level.

Referring now to FIG. 1B, FIG. 1B is a data flow diagram illustrating an example process 150 for processing the input data 112, in accordance with at least one embodiment of the present disclosure. The process 150 may be performed using, for example, a geometry determiner 132, and an action representation determiner 134.

At a high level, the process 150 may include the geometry determiner 132 receiving one or more inputs, such the input data 112, and generating one or more outputs, such as the 3D geometry representation 116. The process 150 may also include the action representation determiner 134 receiving one or more inputs, such the 3D geometry representation 116 and an action 136, and generating one or more outputs, such as the 3D action representation 114. While in the example shown, the 3D geometry representation 116 is shown, in other examples, the action representation determiner 134 may operate on a different 3D geometry representation.

In at least one embodiment, the geometry determiner 132 may generate the 3D geometry representation 116 as a point cloud, voxels, and/or other explicit 3D forms. Due to the limited perspective provided by the input data 112 (e.g., representation a partial observation), the 3D geometry representation 116 may be a partial 3D geometry representation, such as a partial point cloud illustrated in FIG. 1B. Various approaches may be used to generate the 3D geometry representation 116, such as from structure-from-motion and/or laser scans. In at least one embodiment, the geometry determiner 132 may generate the 3D geometry representation 116 using back-projection of the image(s) 142.

In at least one embodiment, the action representation determiner 134 may generate the 3D action representation 114 based at least on fusing the 3D geometry representation 116 or a different 3D geometry representation of an observation with the action 136. In at least one embodiment, the action 136 may comprise an action command representing a physical manipulation of the object 140. By way of example, the action may include a grasp of the object 140 and a release of the object 140. For example, an action at time t may be referred to as action $a_t$, where $a_t=(p_g, p_r)$ with $p_g$ representing a grasp location(s) and $p_r$ representing a release location(s).

In at least one embodiment, a location(s) of the object 140 in the 3D geometry representation 116 may be fused with the action 136 based at least on a distance between the grasp location(s) and the location(s) of the object 140 in the 3D geometry representation 116. For example, for each point or location $p_i \in o_i$ (wherein or may represent the observation at time t), a distance may be computed between $p_i$ and $p_g$. As an example, per-point features may be assigned as $(p_g\text{-}p_i, p_r)$ to form the 3D action representation 114.

The process 100 may implement an action-conditional dynamics model of deformable objects in cluttered environments learned from observations (e.g., captured at least in part by the input data 112). An agent (e.g., a physical or virtual robot or other machine) at time t may take an observation $o_t$ (e.g., a partial observation) from a fixed RGB-D camera(s) of the underlying 3D state $s_t$, and perform a high-level action command $a_t=(p_g, p_r) \in \mathbb{R}3\times\mathbb{R}3$, which represents grasping the object at point $p_g$, moving the gripper to $p_r$, and releasing. In at least one embodiment, the model may include a geometry prediction module $f_r$ represented using Equation (1):

$$f_r(o_t) \rightarrow s_t \qquad (1)$$

where the agent may estimate the underlying 3D state from a partial observation.

The model may also include a dynamics prediction module $f_d$ represented using Equation (2):

$$f_d(s_t, a_t) \rightarrow s_{t+1} \qquad (2)$$

where the agent infers the future state conditioned on the action and the future state.

The model may further include an evaluation module that computes a measure of state-distance d using Equation (3):

$$d(s_t, S_t) \rightarrow v \in \mathbb{R} \qquad (3)$$

for state-based evaluation. In at least one embodiment, the measure of state-distance d may be computed using a non-parameterized metric, such as mean intersection-over-union or Chamfer distance, or a learned distance from a correspondence prediction module, where per-point distance between corresponding points may be used to compute state distance.

Disclosed approaches may use implicit representations for dynamics, correspondences, and geometry. Implicit models may represent shapes and/or other object characteristics continuously and naturally handle complicated topologies. In contrast, explicit representations require discretization (e.g., in terms of a number of voxels, points or vertices).

Returning to FIG. 1A, the geometry prediction module $f_r$ may perceive partial volumetric objects and perform continuous implicit encoding as well as 3D completion to enable reasoning about the full geometry of the objects. The perception encoder 104 may encode the 3D geometry representation 116 (e.g., a point cloud) into the geometry features 120. In at least one embodiment, the geometry features 120 may include a 2D or 3D feature grid. In at least one embodiment, the perception encoder 104 may process the 3D geometry representation 116 with a task-specific MLM(s) (e.g., one or more neural networks), which may provide a feature encoding for every point, voxel, and/or location. For example, a one-layer 3D convolutional neural network may be used for voxelized inputs, and a shallow point-based 3D classifier with local pooling may be used for 3D point clouds. Using these features, the perception encoder 104 may construct planar and volumetric feature representations in order to encapsulate local neighborhood information.

In at least one embodiment, for each input location or element, the 3D geometry representation 116 may perform an orthographic projection onto a plane (e.g., a canonical plane aligned with the axes of the coordinate frame). The plane may be discretized at a resolution of H×W pixel cells, where H may refer to the height and W to the width. For voxel inputs, the voxel center may be treated as a point and projected to the plane. The perception encoder 104 may aggregate features based at least on projecting onto the same pixel using average pooling, resulting in planar features with dimensionality H×W×d, where d may refer to the feature dimension. In various embodiments, the features may be projected onto a ground plane or one or more canonical planes (e.g., three). Disclosed embodiments are not limited to the geometry features 120 comprising planar feature representations (e.g., for spatial encoding), and other feature representations may be used, such as, and without limitation, volumetric encodings.

The implicit geometry determiner 108 may use at least the geometry features 120 to generate the implicit geometry data 124. The implicit geometry determiner 108 may include a coordinate-based implicit decoder used to capture the object 140 using an implicit 3D representation $f_\theta: \mathbb{R}^3 \rightarrow \{0, 1\}$. To generate the implicit geometry data 124, the implicit geometry determiner 108 may, for point $p \in \mathbb{R}^3$, query a feature vector $\psi(p, o_t)$ corresponding to the geometry features 120 using bilinear interpolation of the projected p on each feature plane, and sum the features of all three canonical planes. The implicit geometry decoder may be used to generate an occupancy prediction: $f_\theta(p, \psi(p, o_t)) \rightarrow [0, 1]$. FIG. 1A shows an example visualization of an occupancy field, which may be determined by the implicit geometry determiner 108.

The dynamics prediction module $f_d$ may be action-conditional, and may learn general deformable dynamics without categorical priors. The action encoder 102 may encode the 3D action representation 114 into the action features 118 using the same encoder architecture as the perception encoder 104 or a different architecture. Using the 3D action representation 114, the action 136 may be encoded jointly with the observation ot. Thus, the action features 118 may, for example, be represented using one or more canonical planes (e.g., three).

In at least one embodiment, the action encoder 102 may encode a 3D geometry representation corresponding to the entire scene captured from the observation(s) (e.g., the input data 112) into scene geometry features (e.g., into another three canonical features planes) and concatenate the encoded scene geometry with the action encoding to produce the action features 118. This approach may allow the dynamics model to contextualize the environment. Thus, the dynamics model may exhibit improved performance for deformable objects situated in cluttered environments, where, as the layout may be randomized, an object may collide with a different set of obstacles, resulting in complex non-linear dynamics.

The implicit dynamics determiner 106 may use the action features 118 and the geometry features 120 to generate the implicit dynamics data 122 (e.g., comprising an implicit 3D representation of dynamics from performing the action on the object). For example, the implicit dynamics determiner 106 may include a coordinate-based implicit decoder used to capture the dynamics of the object 140 using an implicit 3D representation $f_\theta$, $(p, \psi'(p, a_t, o_t) \rightarrow \mathbb{R}^3$ corresponding to a one-step forward flow.

In the example shown, the dynamics prediction module $f_d$ is conditioned on St, which may be represented implicitly as an occupancy function. An end-to-end approach may be used to eliminate the need to extract explicit 3D shapes during training. In at least one embodiment, the dynamics prediction module $f_d$ may be learned jointly with the geometry prediction module $f_r$. For example, joint learning may be accomplished using representation fusion. When predicting occupancy for point p, the implicit dynamics determiner 106 may encode p into a set of point-specific intermediate representations $r_p$. The intermediate representations $r_p$ and a point-specific feature embedding fp (e.g., produced by the implicit correspondence determiner 110) may be provided as additional input into the dynamics prediction module $f_d$, resulting in the dynamics prediction module becoming $f_\theta$, (p, $\psi'(p, a_t, r_p, f_p)) \rightarrow \mathbb{R}^3$.

To generate the implicit dynamics data 122, the implicit dynamics determiner 106 may, for point $p \in \mathbb{R}^3$, query a feature vector y (p, or) corresponding to the geometry features 120 fused with the action features 118 using bilinear interpolation of the projected p on each feature plane, and sum the features of all three canonical planes. The implicit dynamics decoder may be used to generate the dynamics prediction. FIG. 1A shows an example visualization of a forward-flow field, which may be determined by the implicit dynamics determiner 106.

The evaluation module may use the distance determiner 128 to compute the measure of state-distance d. When evaluating a deformable object of in varying configurations, a critical challenge is to establish the dense correspondence between two visual observations of the same object in drastically different configurations. Disclosed approaches may jointly predict the implicit correspondence data 126, which may include a correspondence embedding field. FIG. 1A shows an example visualization of a correspondence embedding field for state $s_t$, which may be determined by the implicit correspondence determiner 110. FIG. 1A also shows an example visualization of a correspondence embedding field for state $s_t$; which may be determined by in a similar or different manner as the correspondence embedding field for state $s_t$ (e.g., using an instance of the perception encoder 104 and the implicit correspondence determiner 110).

In at least one embodiment, the implicit correspondence determiner 110 may include one or more MLMs that learn correspondences between locations of an object using contrastive learning. For example, and without limitation, an MLM(s) described herein may include any type of machine learning model, such as a machine learning model(s) using linear regression, logistic regression, decision trees, support vector machines (SVM), Naïve Bayes, k-nearest neighbor (Knn), K means clustering, random forest, dimensionality reduction algorithms, gradient boosting algorithms, neural networks (e.g., auto-encoders, convolutional, recurrent, perceptrons, Long/Short Term Memory (LSTM), Hopfield, Boltzmann, deep belief, deconvolutional, generative adversarial, liquid state machine, etc.), and/or other types of machine learning models. In various examples, an MLM may include one or more convolutional neural networks.

Figure 2:
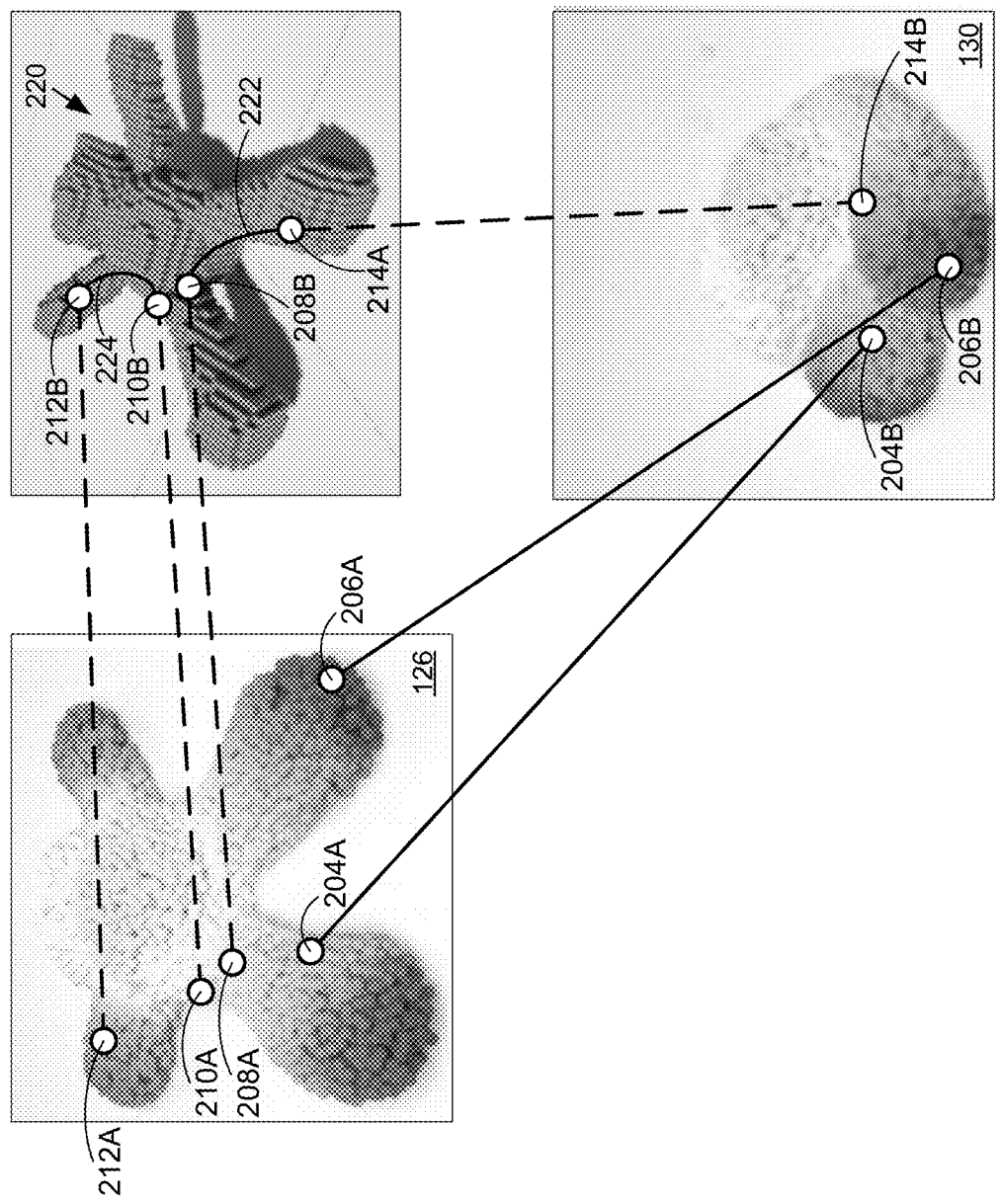
FIG. 2 is a diagram illustrating an example of surface distance-based contrastive learning, in accordance with at least one embodiment of the present disclosure.

Referring now to FIG. 2, FIG. 2 is a diagram illustrating an example of surface distance-based contrastive learning, in accordance with at least one embodiment of the present disclosure. Disclosed approaches may be used to determine portions of objects that are the same or substantially the same across different states of objects. For example, disclosed approaches may be used to determine that a point 204A of the object 140 for the state corresponding to the implicit correspondence data 126 is the same as the point 204B of the object 140 for the state corresponding to the implicit correspondence data 130 (e.g., within a threshold of certainty), or that a point 206A of the object 140 for the state corresponding to the implicit correspondence data 126 is the same as the point 206B of the object 140 for the state corresponding to the implicit correspondence data 130.

Disclosed approaches may also be used to determine amounts or levels of correspondences between portions of objects across different states of objects or within the same state. For example, disclosed approaches may be used to compute a distance between a point 208A of the object 140 for the state corresponding to the implicit correspondence data 126 and a point 214B of the object 140 for the state corresponding to the implicit correspondence data 130, or a distance between a point 210A of the object 140 and a point 212A of the object 140 for the state corresponding to the implicit correspondence data 126. While the process 100 uses disclosed approaches to evaluate distances and/or similarities between states for evaluating action-conditional motion, in some embodiments other approaches may be used, disclosed approaches may be used for purposes other than evaluating action-conditional motion, or disclosed approaches may be used in a different process for evaluating action-conditional motion (e.g., which may not include the action encoder 102, the implicit dynamics determiner 106, the implicit geometry determiner 108, and/or the perception encoder 104).

Correspondences between locations of the object 140 could be learned using Euclidian distance. However, points on a deformable object can have a drastic surface distance, such as a geodesic distance, while being physically close to each other in space. For example, when an arm of the object 140 is touching the belly, the arm and belly have zero Euclidean distance, but they are far-away parts or portions of the object 140. By incorporating surface-based distances into the feature space, the correspondences determined using the disclosed approaches can avoid such misalignments. Jointly training dynamics with Euclidean-based distance correspondence may describes dynamics prediction performance. However, jointly training dynamics with surface-based distance correspondence may increase both dynamics prediction performance and correspondence prediction performance.

In at least one embodiments, for a pair of states $s_t$, $s_t'$ under non-rigid deformation, the system may determine a set of correspondences C={(p,q)|p ∈ $s_t$, q ∈ st'}. Using contrastive learning, a point embedding f may be learned that for points p and q minimize a loss which may be defined using Equation (4):

$$L(f_p, f_q) = I_{pq}[D(f_p, f_q) - m_{pos}]_+^2 + \bar{I}_{pq}[m_{neg} - D(f_p, f_q)]_+^2 \quad (4)$$

where D (·,·) is a distance measure, $I_{pq}$=1 if (p,q) ∈ C and 0 otherwise, ⁻ is the NOT operator, and $m_{pos}$ and $m_{neg}$ are margins for positive and negative pairs.

To incorporate surface-based distance into the original shape manifold, L may be extended according to Equation 5:

$$L_{geo}(f_p, f_q) = \quad (5)$$
$$I_{pq}^g[D(f_p, f_q) - m_{pos}]_+^2 + \bar{I}_{pq}^g\left[\log\left(\frac{d_S(p, q)}{d_{thres}}\right) + m_{neg} - D(f_p, f_q)\right]_+^2$$

where $d_s(p,q)$ is a surface-based function, $d_{thres}$ is a distance threshold, and $I_{pg}^g$=1 if $d_s(p,q)<d_{thres}$ and 0 otherwise.

The point embedding f may be formulated as an embedding field, which may be learned as $f_\theta(p, \psi(p, o_t)) \to fp$ jointly with the implicit geometry decoder. To compute a measure of state-distance d using Equation (3), the distance determiner 128 may compute the mean correspondence distance using Equation (6):

$$\xi_{corr} := \underset{\xi:s_t \to s_{t+1}}{\operatorname{argmin}} \sum_{p \in s_t} D(f_p, f_{\xi(p)}) \quad (6)$$

$$d_{corr}(s_t, s_{t'}) := \frac{1}{|s_t|} \sum_{p \in s_t} \|p - \xi(p)\|^2$$

As indicated in FIG. 2, for each volumetric shape S, a graph G of connected tetrahedrons 220 (or one or more other shapes) of a fixed resolution may be approximated. For two arbitrary points p, q ∈ S, the system may retrieve their corresponding tetrahedrons $t_p$, $t_q$ ∈ G, and compute the surface-based function $d_s(p,q)$ between p and q. For example, FIG. 2 shows a distance 222 between the point 208B and the point 214A, and a distance 224 between the point 212B and the point 210B. In embodiments that use the geodesic distance, the surface-based function $d_s(p,q)$ may be computed as the shortest path distance between tp and tq in graph G. During non-rigid deformation, though each tetrahedron is deformed, the connectivity of the structure remains fixed, which establishes $d_s$ as a deformation-consistent metric.

The process 100 may be used for various purposes, such as model-based planning in order for an agent to determine downstream deformable manipulation tasks. In at least one embodiment, the model-based planning may be target-driven, where the target may be represented by visual observations and/or a 3D geometry representation. For example, the current configuration, or state, may correspond to the implicit correspondence data 126 and the target configuration, or state, may correspond to the implicit correspondence data 130. The implicit correspondence data 130 may be determined similar to the implicit correspondence data 126, for example, using an instance of the perception encoder 104 and the implicit correspondence determiner 110, as described herein. Further, similar to the current state, the target state may be specified using one or more RGB-D images or may be specified more directly using a 3D geometry representation. The model-based planning may use a cost function cost ($a_1$, . . . , $a_n$) that operates on a sequence of actions $a_1$ through $a_n$. The cost function may be used to guide the selection of the actions in order to minimize the cost and/or satisfy one or more criteria. For example, using instances of the process 100, the system may iteratively roll out future states under a given action sequence and compute the cost, at least in part, by measuring state distance (e.g., using Equation (6)). The action sequence of the lowest cost may be chosen.

In realistic scenes, the object of interest may only occupies a small portion of the 3D space. At training time, query points $p \in \mathbb{R}^3$ may be sampled from a multivariate normal distribution with a mean of the object's center-of-mass and with a standard deviation proportional to the size of the object bounding box. The object of interest may be specified via a 2D instance segmentation mask that is jointly passed into the system with the RGB-D image. The implicit geometry decoder may supervised by a binary cross-entropy loss between the predicted and the ground-truth value at the sampled 3D coordinates. The correspondence features may supervised with geodesic-based contrastive loss L according to Equation (5). The forward flow may be supervised by mean squared error.

A dataset may be generated for testing, training, verification, and/or benchmarking that includes action information and the resulting ground-truth objection motions. In at least one embodiment, the dataset may include realistic actions and sensor simulation data for deformable objects in one or more visual and layout randomized scenes. The dataset may be generated using a framework built on a system for performing collaborative content creation for 3D assets. The system may include cloud-based physical simulation that is GPU-accelerated. In at least one embodiment, the physical simulation may include finite element method simulation that represents a deformable body volumetrically as a graph of connected tetrahedrons and/or other shapes.

The framework may generate one or more realistic randomized scenes with one or more category of objects and/or object variations for simulation. A scene may additionally include one or more randomized obstacles. For each action sequence, the object pose, scene obstacles layout, and lighting may be randomized to avoid overfitting. Actions may be implemented using the simulation engine. For visual dynamics model evaluation, the objects may be split into categories for training and testing. For downstream manipulation tasks, start and target configurations may be randomly sampled.

Figure 3:
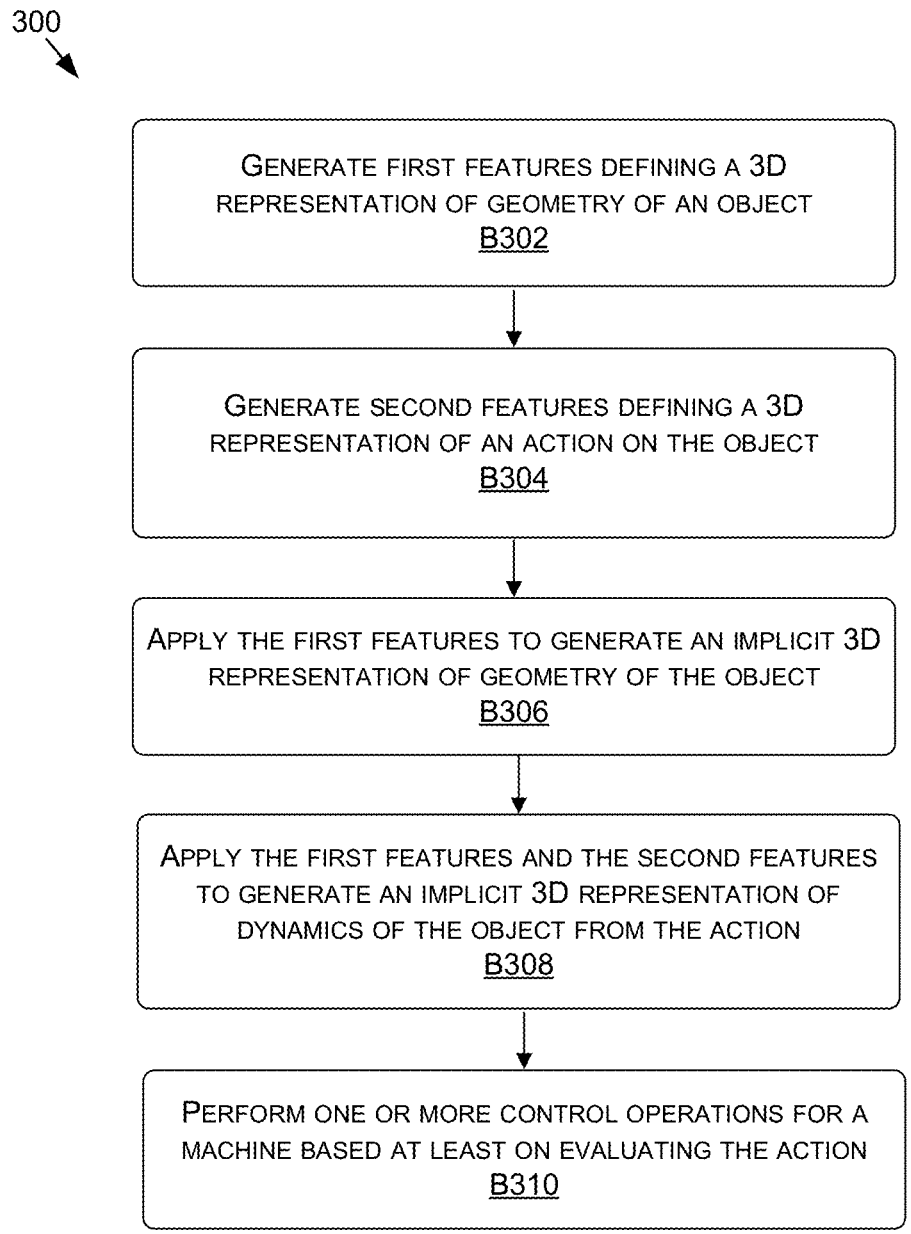
FIG. 3 is a flow diagram showing an example of a method for determining geometry of an object and dynamics from performing an action on the object using sensor data, in accordance with at least one embodiment of the present disclosure.
Figure 4:
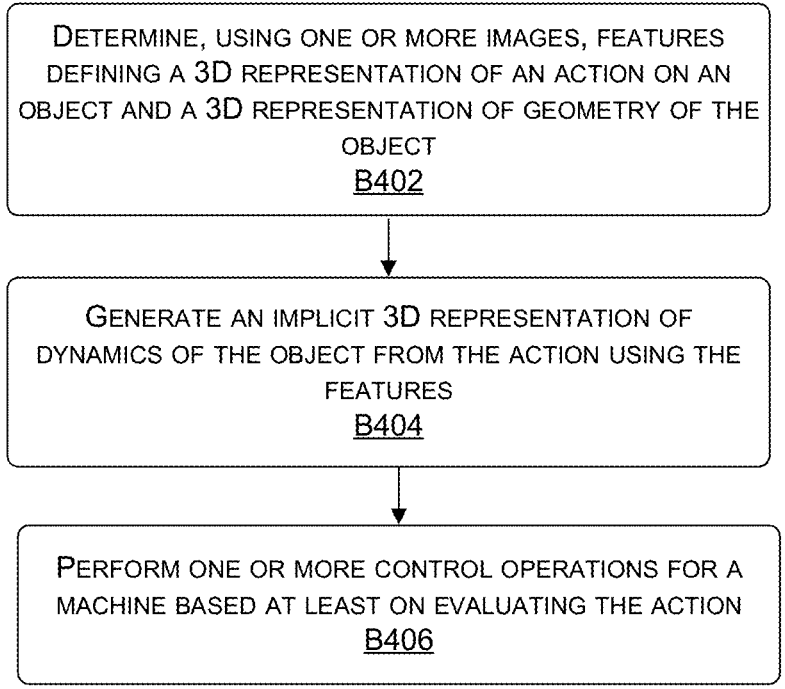
FIG. 4 is a flow diagram showing an example of a method for determining dynamics from performing an action on an object using one or more images, in accordance with at least one embodiment of the present disclosure.

Now referring to FIGS. 3 and 4, each block of methods 300 and 400, and other methods described herein, comprises a computing process that may be performed using any combination of hardware, firmware, and/or software. For instance, various functions may be carried out by a processor executing instructions stored in memory. The methods may also be embodied as computer-usable instructions stored on computer storage media. The methods may be provided by a standalone application, a service or hosted service (standalone or in combination with another hosted service), or a plug-in to another product, to name a few. In addition, the methods are described, by way of example, with respect to the systems components of FIGS. 1A and 1B. However, these methods may additionally or alternatively be executed by any one system, or any combination of systems, including, but not limited to, those described herein.

FIG. 3 is a flow diagram showing an example of a method 300 for determining geometry of an object and dynamics from performing an action on the object using sensor data, in accordance with at least one embodiment of the present disclosure. The method 300, at block B302, includes generating first features defining a 3D representation of geometry of an object. For example, the perception encoder 104 may generate, using sensor data capturing at least a portion of the object 140 in an environment, geometry features 120 defining a 3D representation of geometry of the object 140.

The method, at block B304, includes generating second features defining a 3D representation of an action on the object. For example, the action encoder 102 may generate, using the sensor data, action features 118 defining a 3D representation of the action 136 on the object 140.

The method, at block B306 includes applying the first features to generate an implicit 3D representation of geometry of the object. For example, the geometry features 120 may be applied to the implicit geometry determiner 108 to generate an implicit 3D representation of geometry of the object, corresponding to the implicit geometry data 124.

The method, at block B308 includes applying the first features and the second features to generate an implicit 3D representation of dynamics of the object from the action. For example, the geometry features 120 and the action features 118 may be applied to the implicit dynamics determiner 106 to generate an implicit 3D representation of dynamics of the object from the action 136, corresponding to the implicit dynamics data 122.

The method, at block B310 includes performing one or more control operations for a machine based at least on evaluating the action. For example, one or more control operations may be performed for a machine based at least on evaluating the action 136 using the implicit 3D representation of dynamics and the implicit 3D representation of geometry of the object 140.

FIG. 4 is a flow diagram showing an example of a method 400 for determining dynamics from performing an action on an object using one or more images, in accordance with at least one embodiment of the present disclosure.

The method 400, at block B402, includes determining, using one or more images, features defining a 3D representation of an action on an object and a 3D representation of geometry of the object. For example, the processes 100 and 150 may determine, using the image(s) 142 that depict at least a portion of the object 140 in an environment, the action features 118 defining a 3D representation of the action 136 on the object 140 and the geometry features 120 defining a 3D representation of geometry of the object 140.

The method 400, at block B404, includes generating an implicit 3D representation of dynamics of the object from the action using the features. For example, the implicit dynamics determiner 106 may generate an implicit 3D representation of dynamics of the object from the action 136, corresponding to the implicit dynamics data 122, using one or more MLMs that operate on the action features 118 and the geometry features 120.

The method, at block B406 includes performing one or more control operations for a machine based at least on evaluating the action. For example, one or more control operations may be performed for a machine based at least on evaluating the action 136 using the implicit 3D representation of dynamics of the object 140.

Example Computing Device

Figure 5:
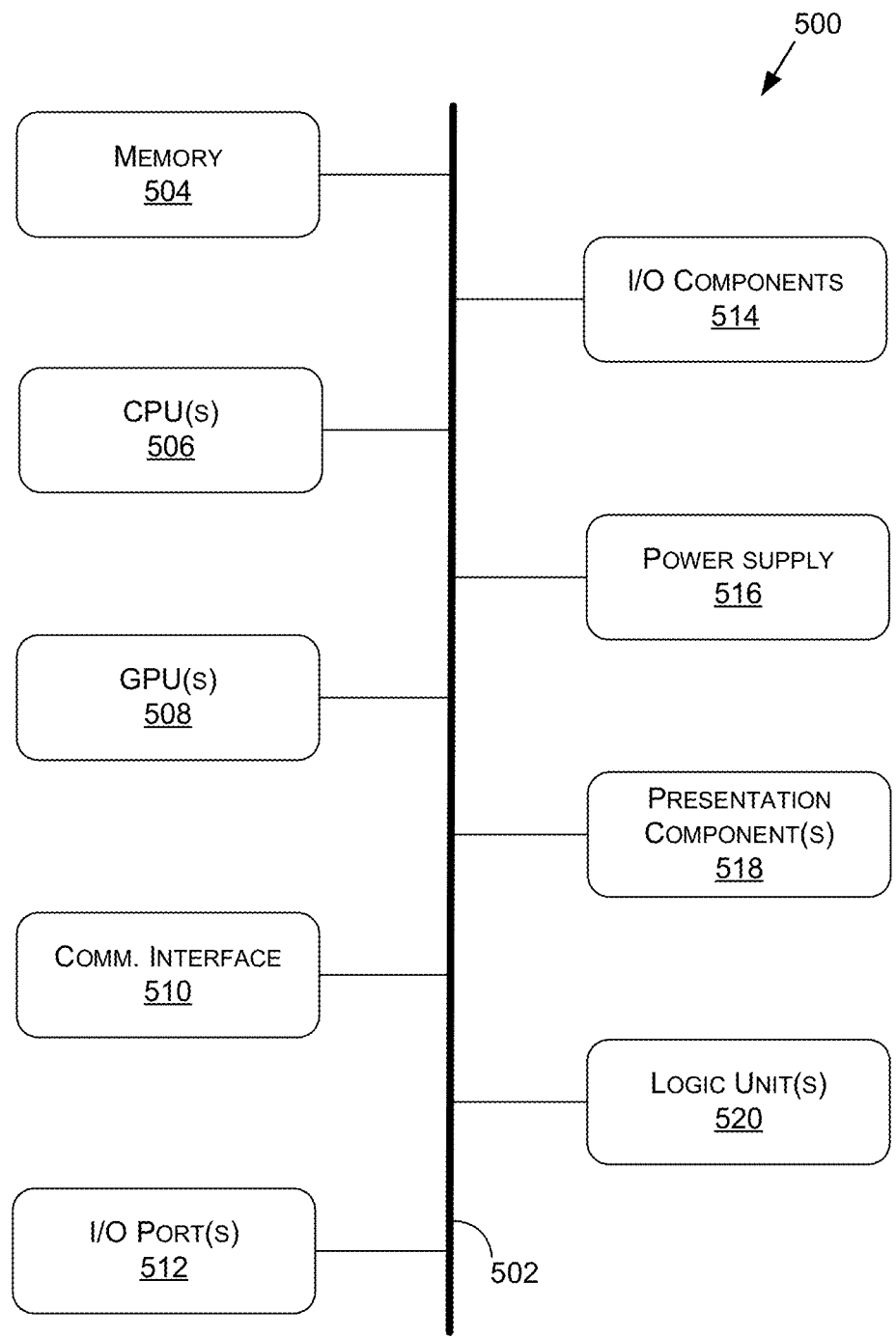
FIG. 5 is a block diagram of an example computing environment suitable for use in implementing at least one embodiment of the present disclosure.

FIG. 5 is a block diagram of an example computing device(s) 500 suitable for use in implementing some embodiments of the present disclosure. Computing device 500 may include an interconnect system 502 that directly or indirectly couples the following devices: memory 504, one or more central processing units (CPUs) 506, one or more graphics processing units (GPUs) 508, a communication interface 510, input/output (I/O) ports 512, input/output components 514, a power supply 516, one or more presentation components 518 (e.g., display(s)), and one or more logic units 520. In at least one embodiment, the computing device(s) 500 may comprise one or more virtual machines (VMs), and/or any of the components thereof may comprise virtual components (e.g., virtual hardware components). For non-limiting examples, one or more of the GPUs 508 may comprise one or more vGPUs, one or more of the CPUs 506 may comprise one or more vCPUs, and/or one or more of the logic units 520 may comprise one or more virtual logic units. As such, a computing device(s) 500 may include discrete components (e.g., a full GPU dedicated to the computing device 500), virtual components (e.g., a portion of a GPU dedicated to the computing device 500), or a combination thereof.

Although the various blocks of FIG. 5 are shown as connected via the interconnect system 502 with lines, this is not intended to be limiting and is for clarity only. For example, in some embodiments, a presentation component 518, such as a display device, may be considered an I/O component 514 (e.g., if the display is a touch screen). As another example, the CPUs 506 and/or GPUs 508 may include memory (e.g., the memory 504 may be representative of a storage device in addition to the memory of the GPUs 508, the CPUs 506, and/or other components). In other words, the computing device of FIG. 5 is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 5.

The interconnect system 502 may represent one or more links or busses, such as an address bus, a data bus, a control bus, or a combination thereof. The interconnect system 502 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus or link. In some embodiments, there are direct connections between components. As an example, the CPU 506 may be directly connected to the memory 504. Further, the CPU 506 may be directly connected to the GPU 508. Where there is direct, or point-to-point connection between components, the interconnect system 502 may include a PCIe link to carry out the connection. In these examples, a PCI bus need not be included in the computing device 500.

The memory 504 may include any of a variety of computer-readable media. The computer-readable media may be any available media that may be accessed by the computing device 500. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 504 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by computing device 500. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

The CPU(s) 506 may be configured to execute at least some of the computer-readable instructions to control one or more components of the computing device 500 to perform one or more of the methods and/or processes described herein. The CPU(s) 506 may each include one or more cores (e.g., one, two, four, eight, twenty-eight, seventy-two, etc.) that are capable of handling a multitude of software threads simultaneously. The CPU(s) 506 may include any type of processor, and may include different types of processors depending on the type of computing device 500 implemented (e.g., processors with fewer cores for mobile devices and processors with more cores for servers). For example, depending on the type of computing device 500, the processor may be an Advanced RISC Machines (ARM) processor implemented using Reduced Instruction Set Computing (RISC) or an x86 processor implemented using Complex Instruction Set Computing (CISC). The computing device 500 may include one or more CPUs 506 in addition to one or more microprocessors or supplementary co-processors, such as math co-processors.

In addition to or alternatively from the CPU(s) 506, the GPU(s) 508 may be configured to execute at least some of the computer-readable instructions to control one or more components of the computing device 500 to perform one or more of the methods and/or processes described herein. One or more of the GPU(s) 508 may be an integrated GPU (e.g., with one or more of the CPU(s) 506 and/or one or more of the GPU(s) 508 may be a discrete GPU. In embodiments, one or more of the GPU(s) 508 may be a coprocessor of one or more of the CPU(s) 506. The GPU(s) 508 may be used by the computing device 500 to render graphics (e.g., 3D graphics) or perform general purpose computations. For example, the GPU(s) 508 may be used for General-Purpose computing on GPUs (GPGPU). The GPU(s) 508 may include hundreds or thousands of cores that are capable of handling hundreds or thousands of software threads simultaneously. The GPU(s) 508 may generate pixel data for output images in response to rendering commands (e.g., rendering commands from the CPU(s) 506 received via a host interface). The GPU(s) 508 may include graphics memory, such as display memory, for storing pixel data or any other suitable data, such as GPGPU data. The display memory may be included as part of the memory 504. The GPU(s) 508 may include two or more GPUs operating in parallel (e.g., via a link). The link may directly connect the GPUs (e.g., using NVLINK) or may connect the GPUs through a switch (e.g., using NVSwitch). When combined together, each GPU 508 may generate pixel data or GPGPU data for different portions of an output or for different outputs (e.g., a first GPU for a first image and a second GPU for a second image). Each GPU may include its own memory, or may share memory with other GPUs.

In addition to or alternatively from the CPU(s) 506 and/or the GPU(s) 508, the logic unit(s) 520 may be configured to execute at least some of the computer-readable instructions to control one or more components of the computing device 500 to perform one or more of the methods and/or processes described herein. In embodiments, the CPU(s) 506, the GPU(s) 508, and/or the logic unit(s) 520 may discretely or jointly perform any combination of the methods, processes and/or portions thereof. One or more of the logic units 520 may be part of and/or integrated in one or more of the CPU(s) 506 and/or the GPU(s) 508 and/or one or more of the logic units 520 may be discrete components or otherwise external to the CPU(s) 506 and/or the GPU(s) 508. In embodiments, one or more of the logic units 520 may be a coprocessor of one or more of the CPU(s) 506 and/or one or more of the GPU(s) 508.

Examples of the logic unit(s) 520 include one or more processing cores and/or components thereof, such as Data Processing Units (DPUs), Tensor Cores (TCs), Tensor Processing Units (TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The communication interface 510 may include one or more receivers, transmitters, and/or transceivers that enable the computing device 500 to communicate with other computing devices via an electronic communication network, included wired and/or wireless communications. The communication interface 510 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet. In one or more embodiments, logic unit(s) 520 and/or communication interface 510 may include one or more data processing units (DPUs) to transmit data received over a network and/or through interconnect system 502 directly to (e.g., a memory of) one or more GPU(s) 508.

The I/O ports 512 may enable the computing device 500 to be logically coupled to other devices including the I/O components 514, the presentation component(s) 518, and/or other components, some of which may be built in to (e.g., integrated in) the computing device 500. Illustrative I/O components 514 include a microphone, mouse, keyboard, joystick, game pad, game controller, satellite dish, scanner, printer, wireless device, etc. The I/O components 514 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 500. The computing device 500 may be include depth cameras, such as stereoscopic camera systems, infrared camera systems, RGB camera systems, touchscreen technology, and combinations of these, for gesture detection and recognition. Additionally, the computing device 500 may include accelerometers or gyroscopes (e.g., as part of an inertia measurement unit (IMU)) that enable detection of motion. In some examples, the output of the accelerometers or gyroscopes may be used by the computing device 500 to render immersive augmented reality or virtual reality.

The power supply 516 may include a hard-wired power supply, a battery power supply, or a combination thereof. The power supply 516 may provide power to the computing device 500 to enable the components of the computing device 500 to operate.

The presentation component(s) 518 may include a display (e.g., a monitor, a touch screen, a television screen, a heads-up-display (HUD), other display types, or a combination thereof), speakers, and/or other presentation components. The presentation component(s) 518 may receive data from other components (e.g., the GPU(s) 508, the CPU(s) 506, DPUs, etc.), and output the data (e.g., as an image, video, sound, etc.).

Example Data Center

Figure 6:
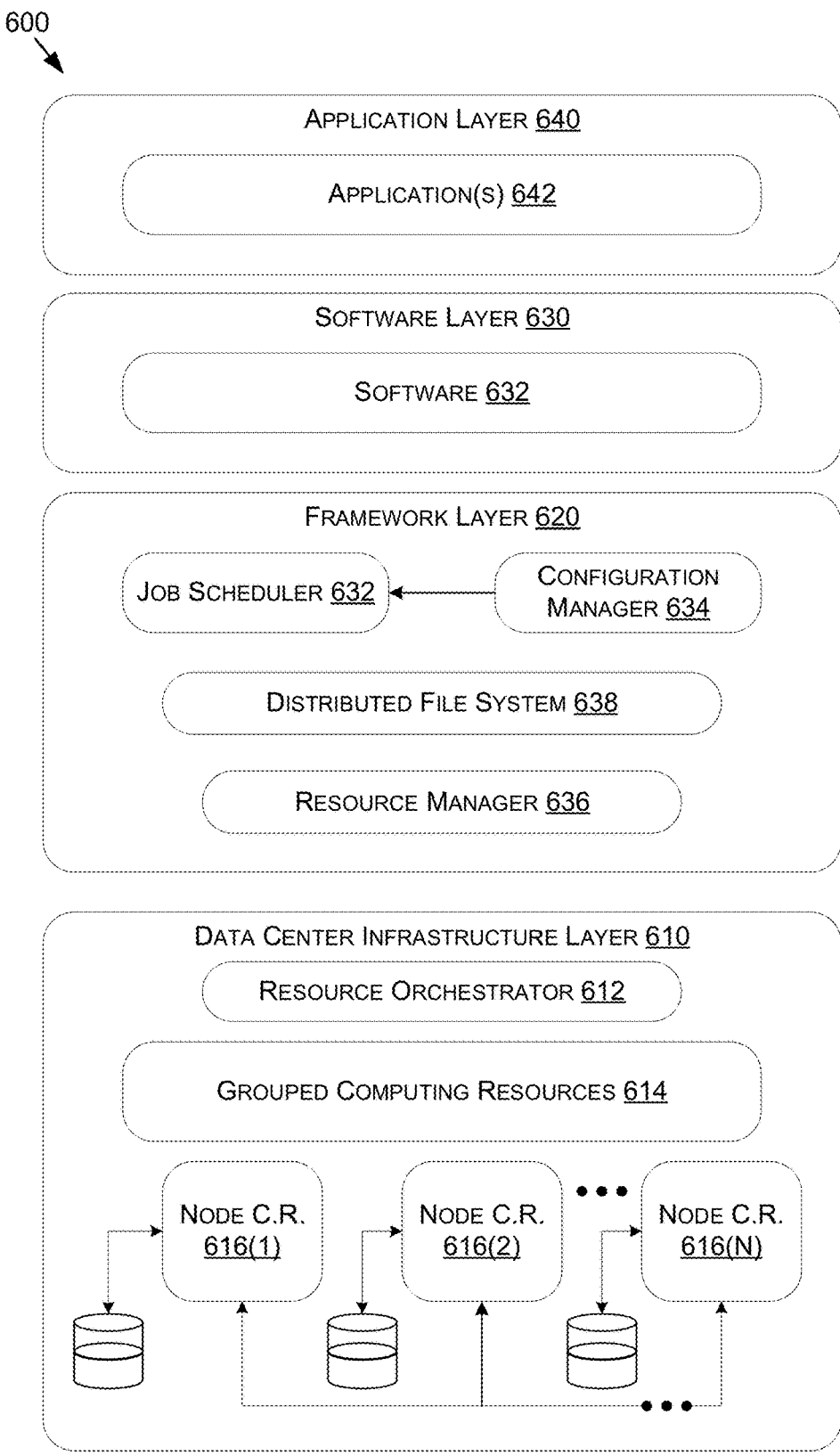
FIG. 6 is a block diagram of an example data center suitable for use in implementing at least one embodiment of the present disclosure.

FIG. 6 illustrates an example data center 600 that may be used in at least one embodiments of the present disclosure. The data center 600 may include a data center infrastructure layer 610, a framework layer 620, a software layer 630, and/or an application layer 640.

As shown in FIG. 6, the data center infrastructure layer 610 may include a resource orchestrator 612, grouped computing resources 614, and node computing resources ("node C.R.s") 616(1)-616(N), where "N" represents any whole, positive integer. In at least one embodiment, node C.R.s 616(1)-616(N) may include, but are not limited to, any number of central processing units (CPUs) or other processors (including DPUs, accelerators, field programmable gate arrays (FPGAs), graphics processors or graphics processing units (GPUs), etc.), memory devices (e.g., dynamic read-only memory), storage devices (e.g., solid state or disk drives), network input/output (NW I/O) devices, network switches, virtual machines (VMs), power modules, and/or cooling modules, etc. In some embodiments, one or more node C.R.s from among node C.R.s 616(1)-616(N) may correspond to a server having one or more of the above-mentioned computing resources. In addition, in some embodiments, the node C.R.s 616(1)-6161(N) may include one or more virtual components, such as vGPUs, vCPUs, and/or the like, and/or one or more of the node C.R.s 616(1)-616(N) may correspond to a virtual machine (VM).

In at least one embodiment, grouped computing resources 614 may include separate groupings of node C.R.s 616 housed within one or more racks (not shown), or many racks housed in data centers at various geographical locations (also not shown). Separate groupings of node C.R.s 616 within grouped computing resources 614 may include grouped compute, network, memory or storage resources that may be configured or allocated to support one or more workloads. In at least one embodiment, several node C.R.s 616 including CPUs, GPUs, DPUs, and/or other processors may be grouped within one or more racks to provide compute resources to support one or more workloads. The one or more racks may also include any number of power modules, cooling modules, and/or network switches, in any combination.

The resource orchestrator 612 may configure or otherwise control one or more node C.R.s 616(1)-616(N) and/or grouped computing resources 614. In at least one embodiment, resource orchestrator 612 may include a software design infrastructure (SDI) management entity for the data center 600. The resource orchestrator 612 may include hardware, software, or some combination thereof.

In at least one embodiment, as shown in FIG. 6, framework layer 620 may include a job scheduler 632, a configuration manager 634, a resource manager 636, and/or a distributed file system 638. The framework layer 620 may include a framework to support software 632 of software layer 630 and/or one or more application(s) 642 of application layer 640. The software 632 or application(s) 642 may respectively include web-based service software or applications, such as those provided by Amazon Web Services, Google Cloud and Microsoft Azure. The framework layer 620 may be, but is not limited to, a type of free and open-source software web application framework such as Apache Spark™ (hereinafter "Spark") that may utilize distributed file system 638 for large-scale data processing (e.g., "big data"). In at least one embodiment, job scheduler 632 may include a Spark driver to facilitate scheduling of workloads supported by various layers of data center 600. The configuration manager 634 may be capable of configuring different layers such as software layer 630 and framework layer 620 including Spark and distributed file system 638 for supporting large-scale data processing. The resource manager 636 may be capable of managing clustered or grouped computing resources mapped to or allocated for support of distributed file system 638 and job scheduler 632. In at least one embodiment, clustered or grouped computing resources may include grouped computing resource 614 at data center infrastructure layer 610. The resource manager 636 may coordinate with resource orchestrator 612 to manage these mapped or allocated computing resources.

In at least one embodiment, software 632 included in software layer 630 may include software used by at least portions of node C.R.s 616(1)-616(N), grouped computing resources 614, and/or distributed file system 638 of framework layer 620. One or more types of software may include, but are not limited to, Internet web page search software, e-mail virus scan software, database software, and streaming video content software.

In at least one embodiment, application(s) 642 included in application layer 640 may include one or more types of applications used by at least portions of node C.R.s 616(1)-616(N), grouped computing resources 614, and/or distributed file system 638 of framework layer 620. One or more types of applications may include, but are not limited to, any number of a genomics application, a cognitive compute, and a machine learning application, including training or inferencing software, machine learning framework software (e.g., PyTorch, TensorFlow, Caffe, etc.), and/or other machine learning applications used in conjunction with one or more embodiments.

In at least one embodiment, any of configuration manager 634, resource manager 636, and resource orchestrator 612 may implement any number and type of self-modifying actions based on any amount and type of data acquired in any technically feasible fashion. Self-modifying actions may relieve a data center operator of data center 600 from making possibly bad configuration decisions and possibly avoiding underutilized and/or poor performing portions of a data center.

The data center 600 may include tools, services, software or other resources to train one or more machine learning models or predict or infer information using one or more machine learning models according to one or more embodiments described herein. For example, a machine learning model(s) may be trained by calculating weight parameters according to a neural network architecture using software and/or computing resources described above with respect to the data center 600. In at least one embodiment, trained or deployed machine learning models corresponding to one or more neural networks may be used to infer or predict information using resources described above with respect to the data center 600 by using weight parameters calculated through one or more training techniques, such as but not limited to those described herein.

In at least one embodiment, the data center 600 may use CPUs, application-specific integrated circuits (ASICs), GPUs, FPGAs, and/or other hardware (or virtual compute resources corresponding thereto) to perform training and/or inferencing using above-described resources. Moreover, one or more software and/or hardware resources described above may be configured as a service to allow users to train or performing inferencing of information, such as image recognition, speech recognition, or other artificial intelligence services.

Example Network Environments

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the computing device(s) 500 of FIG. 5—e.g., each device may include similar components, features, and/or functionality of the computing device(s) 500. In addition, where backend devices (e.g., servers, NAS, etc.) are implemented, the backend devices may be included as part of a data center 600, an example of which is described in more detail herein with respect to FIG. 6.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example computing device(s) 500 described herein with respect to FIG. 5. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The disclosure may be practiced in a variety of system configurations, including hand-held devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A method comprising:
generating, using sensor data capturing at least a portion of an object in an environment, first features defining a three-dimensional (3D) representation of geometry of the object;
generating, using the sensor data, second features defining a 3D representation of an action on the object;
applying the first features to one or more first machine learning models (MLMs) trained to generate an implicit 3D representation of geometry of the object;
applying the first features and the second features to one or more second MLMs trained to generate an implicit 3D representation of flow dynamics that would result at locations of the object from performing the action on the object; and
performing one or more control operations for a machine based at least on applying using the implicit 3D representation of flow dynamics of the object, the flow dynamics to the locations using the implicit 3D representation of geometry.

2. The method of claim 1, wherein the generating of the first features is from a partial view of the object in the environment and the one or more first MLMs are trained to predict at least a portion of the object using the first features.

3. The method of claim 1, wherein the performing of the action is on a first physical state of the object, the applying of the flow dynamics to the locations produces a second physical state of the object caused by the performing of the action on the first physical state of the object, and the performing of the one or more control operations is based at least on comparing the second physical state of the object to a goal physical state for the object.

4. The method of claim 1, wherein the action represents a physical manipulation of the object by an external force.

5. The method of claim 1, wherein the one or more first MLMs are trained to generate the implicit 3D representation of geometry of the object as occupancy predictions of the object for the locations in the environment using at least the first features.

6. The method of claim 1, further comprising applying the first features to one or more third MLMs trained to generate an implicit 3D representation of correspondences between positions on the object using the first features based at least on distances between the positions along a surface corresponding to the object, wherein the performing of the one or more control operations is further based on the implicit 3D representation of correspondences.

7. The method of claim 1, wherein the implicit 3D representation of geometry of the object is jointly learned with the implicit 3D representation of flow dynamics of the object.

8. The method of claim 1, wherein the generating of the second features includes:
   determining, using the sensor data, one or more locations of the object; and
   computing one or more distances between one or more grasp locations associated with the action and the one or more locations of the object, wherein the 3D representation of the action on the object is based at least on the one or more distances.

9. A system comprising:
   one or more processing units to execute operations comprising:
      determining, using one or more images that depict an object in an environment, features defining a 3D representation of an action on the object and defining a 3D representation of geometry of the object;
      generating, using one or more machine learning models (MLMs) that operate on the features, an implicit 3D representation of flow dynamics that would result at locations of the object from performing the action on the object; and
      performing one or more control operations of a machine based at least on applying using the implicit 3D representation of flow dynamics of the object, the flow dynamics to the locations using an implicit 3D representation of geometry of the object.

10. The system of claim 9, wherein the 3D representation of geometry of the object is a partial 3D shape of the object perceived from the one or more images, and the one or more MLMs are trained to predict the flow dynamics for the locations at least a portion of the object that is separate from the partial 3D shape.

11. The system of claim 9, wherein the flow dynamics include a forward flow dynamics field corresponding to the locations on the object.

12. The system of claim 9, wherein the determining of the features includes back projecting the one or more images using color information and depth information of the one or more images.

13. The system of claim 9, wherein the operations further include generating occupancy predictions of the object for locations in the environment using at least some of the features corresponding to the 3D representation of geometry of the object, wherein the applying of the flow dynamics is to the occupancy predictions.

14. The system of claim 9, wherein the one or more MLMs are one or more first MLMs and the operations further include applying at least some features of the features corresponding to the 3D representation of geometry of the object to one or more second MLMs trained to generate an implicit 3D representation of correspondences between locations of the object using the at least some features based at least on distances between the locations along a surface corresponding to the object.

15. The system of claim 9, wherein the implicit 3D representation of geometry of the object is jointly learned with the implicit 3D representation of flow dynamics of the object.

16. The system of claim 9, wherein the system is comprised in at least one of:
   a control system for an autonomous or semi-autonomous machine;
   a perception system for an autonomous or semi-autonomous machine;
   a system for performing simulation operations;
   a system for performing light transport simulation;
   a system for performing collaborative content creation for 3D assets;
   a system for performing deep learning operations;
   a system implemented using an edge device;
   a system implemented using a robot;
   a system for performing conversational AI operations;
   a system for generating synthetic data;
   a system incorporating one or more virtual machines (VMs);
   a system implemented at least partially in a data center; or
   a system implemented at least partially using cloud computing resources.

17. At least one processor comprising:
   one or more circuits to:
      generate, using one or more machine learning models (MLMs) and a three-dimensional (3D) representation of an action on an object, an implicit 3D representation of flow dynamics that would result at locations of the object from performing the action on the object, and
      perform one or more control operations for a machine based at least on applying, using the implicit 3D representation of flow dynamics of the object, the flow dynamics to the locations using an implicit 3D representation of geometry of the object.

18. The at least one processor of claim 17, wherein the one or more MLMs are trained using training images and ground-truth data generated using a cloud-based platform that performs physical simulation and photorealistic rendering of one or more objects in one or more virtual environments.

19. The at least one processor of claim 17, wherein the one or more MLMs are jointly trained to decode the implicit 3D representation of flow dynamics, and to decode the implicit 3D representation of geometry of the object.

20. The at least one processor of claim 17, wherein the at least one processor is comprised in at least one of:
   a control system for an autonomous or semi-autonomous machine;
   a perception system for an autonomous or semi-autonomous machine;
   a system for performing simulation operations;
   a system for performing light transport simulation;
   a system for performing collaborative content creation for 3D assets;
   a system for performing deep learning operations;
   a system implemented using an edge device;
   a system implemented using a robot;
   a system for performing conversational AI operations;
   a system for generating synthetic data;
   a system incorporating one or more virtual machines (VMs);
   a system implemented at least partially in a data center; or
   a system implemented at least partially using cloud computing resources.

* * * * *